(12) United States Patent
Nakao et al.

(10) Patent No.: US 9,727,461 B2
(45) Date of Patent: Aug. 8, 2017

(54) STORAGE DEVICE, MEMORY CONTROLLER, AND CONTROL METHOD

(71) Applicant: KABUSHIKI KAISHA TOSHIBA, Tokyo (JP)

(72) Inventors: Kaori Nakao, Tokyo (JP); Fumitoshi Hidaka, Yokohama Kanagawa (JP); Masatoshi Aoki, Yokohama Kanagawa (JP); Itaru Kakiki, Yokohama Kanagawa (JP); Tomoki Yokoyama, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 169 days.

(21) Appl. No.: 14/636,164

(22) Filed: Mar. 2, 2015

(65) Prior Publication Data

US 2015/0363105 A1 Dec. 17, 2015

(30) Foreign Application Priority Data

Jun. 16, 2014 (JP) ................................. 2014-123676

(51) Int. Cl.
*G06F 12/00* (2006.01)
*G06F 12/0802* (2016.01)
*G06F 3/06* (2006.01)

(52) U.S. Cl.
CPC .......... *G06F 12/0802* (2013.01); *G06F 3/068* (2013.01); *G06F 3/0616* (2013.01); *G06F 3/0631* (2013.01); *G06F 2212/222* (2013.01)

(58) Field of Classification Search
CPC .... G06F 12/0802; G06F 3/0616; G06F 3/068; G06F 3/0631; G06F 2212/222
See application file for complete search history.

(56) References Cited

U.S. PATENT DOCUMENTS

| 8,078,794 | B2* | 12/2011 | Lee ....................... G06F 3/0613 |
| | | | 711/103 |
| 8,582,358 | B2 | 11/2013 | Takeyama et al. |
| 9,146,851 | B2* | 9/2015 | Pittelko |
| 9,244,834 | B2* | 1/2016 | Sheredy .............. G11C 11/5628 |
| 2009/0093831 | A1* | 4/2009 | Zhong ................. A61B 5/14532 |
| | | | 606/182 |
| 2010/0153632 | A1* | 6/2010 | Lee ....................... G06F 3/0613 |
| | | | 711/103 |
| 2011/0010488 | A1* | 1/2011 | Aszmann .............. G06F 3/0608 |
| | | | 711/103 |

(Continued)

FOREIGN PATENT DOCUMENTS

| JP | 2010198407 A | 9/2010 |
| JP | 2012118853 A | 6/2012 |
| JP | 2012-203863 A | 10/2012 |

*Primary Examiner* — John A Lane
(74) *Attorney, Agent, or Firm* — Patterson & Sheridan, LLP (57) ABSTRACT

A storage device includes a first nonvolatile memory that includes memory cells, each capable of storing data of a first number of bits, a second nonvolatile memory of which memory capacity is larger than a memory capacity of the first nonvolatile memory, and a memory controller is configured to control the first nonvolatile memory to store data of a second number of bits that is smaller than the first number in each of at least a part of the memory cells according to a usage amount of the memory cells.

20 Claims, 10 Drawing Sheets

(56) References Cited

U.S. PATENT DOCUMENTS

2012/0059992 A1\* 3/2012 Radke ................ G06F 12/0246
     711/114
2013/0254458 A1   9/2013 Pittelko
2013/0336059 A1\* 12/2013 Lee ........................ G11C 29/82
     365/185.09

\* cited by examiner

| PHYSICAL BLOCK ADDRESS | NUMBER OF REWRITING TIMES |
|---|---|
| PB0 ··· | 0 |
| PB2,PB4 ··· | 1 |
|  | 2 |
| PB3,PB5 ··· | 3 |
| ⋮ | ⋮ |
| PBN ··· | WN |
| ⋮ | ⋮ |
|  | WZ |

| PHYSICAL BLOCK ADDRESS | ECC LEVEL |
|---|---|
| PB0 ··· | L0 |
|  | L1 |
| PB2,PB3 ··· | L2 |
| PB1 ··· | L3 |
| ⋮ | ⋮ |
| PBN ··· | LN |
| ⋮ | ⋮ |
|  | LZ |

STORAGE DEVICE, MEMORY CONTROLLER, AND CONTROL METHOD

CROSS-REFERENCE TO RELATED APPLICATION

This application is based upon and claims the benefit of priority from Japanese Patent Application No. 2014-123676, filed Jun. 16, 2014, the entire contents of which are incorporated herein by reference.

FIELD

Embodiments described herein relate generally to a storage device, a memory controller, and a control method.

BACKGROUND

A storage device, known as a hybrid drive, has two different types of nonvolatile memories, such as a magnetic disk and an NAND type flash memory. The magnetic disk is operated at a lower access speed, but is less expensive. On the other hand, the NAND type flash memory is more expensive, but can be operated at a faster access speed. For this reason, the hybrid drive is able to cancel out disadvantages of the magnetic disk and the NAND type flash memory with each other.

DETAILED DESCRIPTION

One embodiment provides a storage device and a method that can maintain reliable data storing performance for a long period of time without losing data capacity excessively.

In general, according to one embodiment, a storage device includes a first nonvolatile memory that includes memory cells, each capable of storing data of a first number of bits, a second nonvolatile memory of which memory capacity is larger than a memory capacity of the first nonvolatile memory, and a memory controller is configured to control the first nonvolatile memory to store data of a second number of bits that is smaller than the first number in each of at least a part of the memory cells according to a usage amount of the memory cells.

Hereinafter, an exemplary embodiment will be described with reference to the drawings. In this description, common reference numerals are applied to common parts over the entire drawings.

First Embodiment

1-1. Configuration of Hybrid Drive (Storage System)

Figure 1:
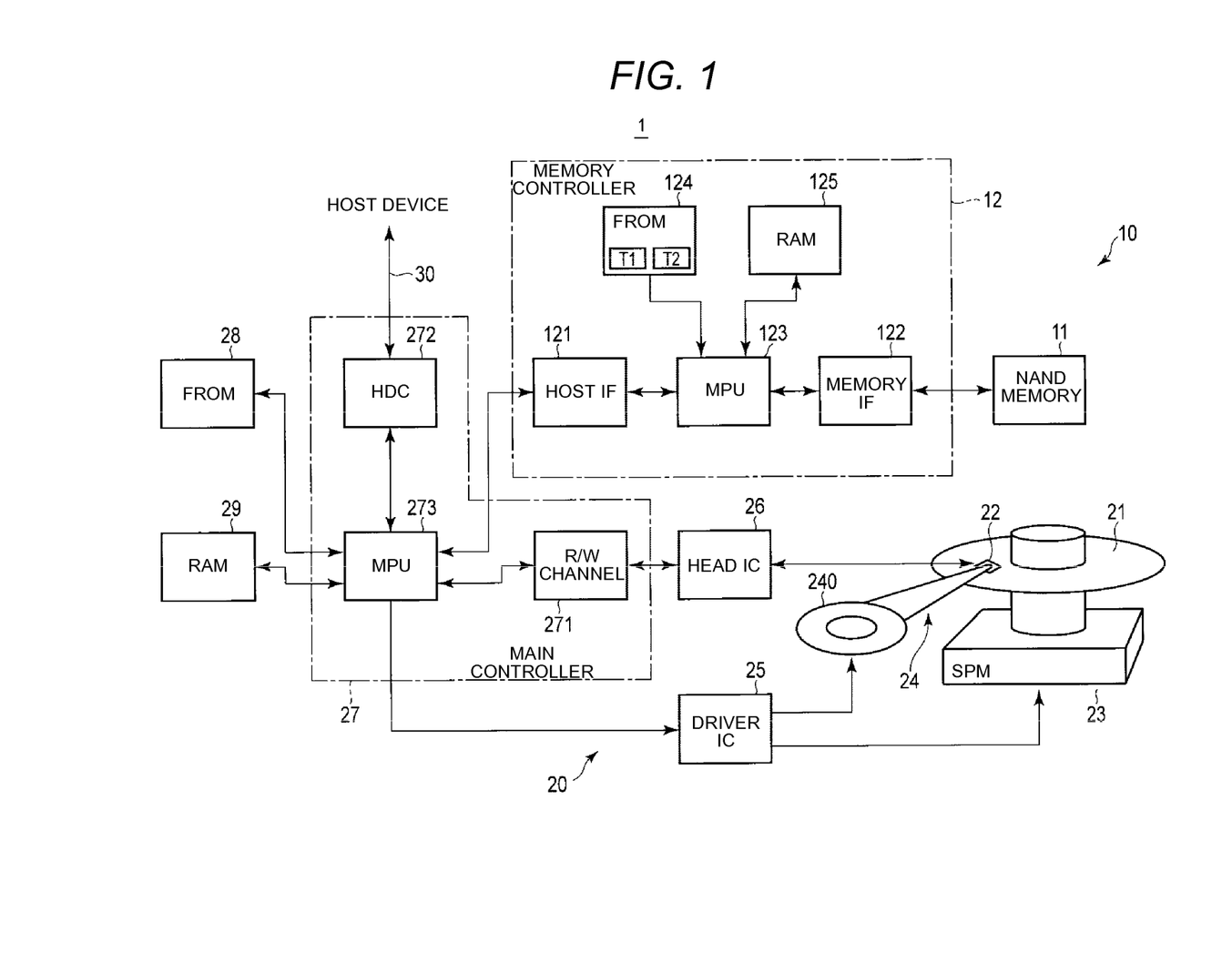
FIG. 1 is a block diagram of a hybrid drive according to a first embodiment.

First, a configuration of hybrid drive (a storage system) 1 according to a first embodiment will be described with reference to FIG. 1. FIG. 1 is a block diagram of the hybrid drive 1 according to the first embodiment. The hybrid drive 1 is mounted on, for example, an electronic device such as a personal computer, a video camera, a music player, a mobile terminal, a mobile phone, a tablet terminal, a printer apparatus, a video recording apparatus, a game console, and a server.

As illustrated, the hybrid drive 1 includes a memory unit 10 which includes a nonvolatile semiconductor memory and a disk unit 20, such as HDD, which includes a magnetic disk.

(A) Memory Unit 10

The memory unit 10 includes an NAND type flash memory (hereinafter "NAND memory") 11 and a memory controller 12.

The NAND memory (a first nonvolatile memory) 11 is used as a cache memory for storing data which is recently accessed by a host device. For this reason, the hybrid drive 1 enables high speed access by the host device when the hybrid drive 1 uses the hybrid device 1 as its own storage device. The NAND memory 11 includes a memory cell array (not illustrated) in which a plurality of memory cells is disposed. Each memory cell is disposed at an intersecting position of one of bit lines and one of word lines. The memory cell array is configured as a storing area in which the data is stored in each of the memory cells. The storing area includes a plurality of blocks, each of which is a data erasing unit, and is categorized into a system area and a cache area. The details of the storing area will be described later.

The memory controller 12 controls the entire access with respect to the NAND memory 11 according to an access request (for example, a write request or a read request) from a main controller 27. The memory controller 12 includes a host interface controller (hereinafter "host IF") 121, a memory interface controller (hereinafter "memory IF") 122, a microprocessor unit (MPU) 123, a flash ROM (FROM) 124, and a random access memory (RAM) 125.

The host IF 121 is electrically connected to the main controller 27. The host IF 121 receives a signal transferred from the main controller 27 and transmits a signal to the main controller 27. In detail, the host IF 121 receives a command (a write command, a read command, or the like) transferred from the main controller 27 and transfers the received command to the MPU 123. The host IF 121 returns a response from the MPU 123 with respect to the command transferred from the main controller 27, to the main controller 27. Thus, the host IF 121 controls a data transfer between the main controller 27 and the MPU 123.

The memory IF 122 is electrically connected to the NAND memory 11, and accesses the NAND memory 11 according to the control of the MPU 123.

The MPU (a control unit) 123 executes an access processing (for example, a write processing or a read processing) with respect to the NAND memory 11 based on the command transferred from the main controller 27 according to a predetermined control program.

The FROM 124 stores the predetermined control program for executing the MPU 123. In addition, the FROM 124 stores tables T1 and T2. The details of the tables T1 and T2 will be described later.

The RAM 125 temporarily stores necessary data. In the RAM 125, a portion of its storing area is used as a work area of the MPU 123.

(B) Disk Unit 20

The disk unit 20 includes a disk 21, a head 22, a spindle motor (SPM) 23, an actuator 24, a driver integrated circuit (IC) 25, a head IC 26, the main controller 27, a flash ROM (FROM) 28, and a RAM 29.

On one surface of the disk (a second nonvolatile memory) 21, for example, a recording surface on which data is magnetically recorded is formed. The disk 21 is rotated by the SPM 23 at a high speed. The SPM 23 is driven by a drive current (or a drive voltage) supplied from the driver IC 25. The disk 21 (more specifically, the recording surface of the disk 21) includes, for example, a plurality of concentric tracks. Furthermore, the disk 21 may include a plurality of tracks which is disposed in the shape of a spiral.

The head (a head slider) 22 is disposed corresponding to the recording surface of the disk 21. The head 22 is attached to a tip end of a suspension extending from an arm of the actuator 24. The actuator 24 includes a voice coil motor (VCM) 240 which is a drive source of the actuator 24. The VCM 240 is driven by the drive current supplied from the driver IC 25. The actuator 24 is driven by the VCM 240, and thus the head 22 is moved over the disk 21 in a radial direction of the disk 21 to draw a circular arc.

Furthermore, in FIG. 1, the disk unit 20 having a single sheet of disk 21 is illustrated. However, an HDD in which a plurality of sheets of disk 21 is stacked may be used. In addition, in FIG. 1, the disk 21 includes the recording surface on the one surface thereof. However, the disk 21 may include recording surfaces on both surfaces thereof, and heads may be disposed corresponding to each of the recording surfaces.

The driver IC 25 drives the SPM 23 and the VCM 240 according to the control of the main controller 27. The VCM 240 is driven by the driver IC 25, and thus the head 22 is positioned at a target track on the disk 21.

The head IC 26 is disposed at a position apart from the actuator 24 in FIG. 1, but the head IC 26 may be fixed to a predetermined position of the actuator 24, and may be electrically connected to the main controller 27 through a flexible printed circuit board (FPC). The head IC 26 amplifies a read signal read by a read element of the head 22. In addition, the head IC 26 converts write data output from the main controller 27 into a write current, and outputs the write current to a write element of the head 22.

The main controller 27 is achieved by, for example, a large-scale integrated circuit (LSI) in which a plurality of components is integrated in a single chip. The main controller 27 includes a read and write (R/W) channel 271, a hard disk controller (HDC) 272, and a MPU 273.

The R/W channel 271 processes signals related to reading and writing. That is, the R/W channel 271 converts the read signal amplified by the head IC 26 into digital data, and decodes read data from the digital data. In addition, the R/W channel 271 encodes the write data transferred from the HDC 272 through the MPU 273, and transfers the encoded write data to the head IC 26.

The HDC 272 is electrically connected to the host device through a host interface (a storage interface) 30. The HDC 272 functions as a host interface controller which receives a signal transferred from the host device and transfers a signal to the host device. In detail, the HDC 272 receives a command (a write command, a read command, or the like) transferred from the host, and passes the received command onto the MPU 273. The HDC 272 controls a data transfer between the host and the MPU 273. The HDC 272 also functions as a disk interface controller which controls the writing with respect to the disk 21 and the reading from the disk 21 through the MPU 273, the R/W channel 271, the head IC 26, and the head 22.

The MPU 273 controls access to the NAND memory 11 through the memory controller 12, and access to the disk 21 through the R/W channel 271, the head IC 26, and the head 22 according to an access request (a write request or a read request) from the host device. The control is executed in accordance with a predetermined control program stored in a FROM 28. A portion of a storing area of the RAM 29 is used as a work area of the MPU 273.

Furthermore, as an example of the hybrid drive 1 according to this embodiment, two nonvolatile memories of the NAND memory 11 and the disk 21 are described. However, the hybrid drive 1 is not limited to the example, and may include a plurality of types of nonvolatile memories having different access speeds or memory capacities from each other.

1-2. NAND Memory

Next, the NAND memory 11 illustrated in FIG. 1 will be described with reference to FIG. 2 to FIG. 4.

(A) Storing Area

Figure 2:
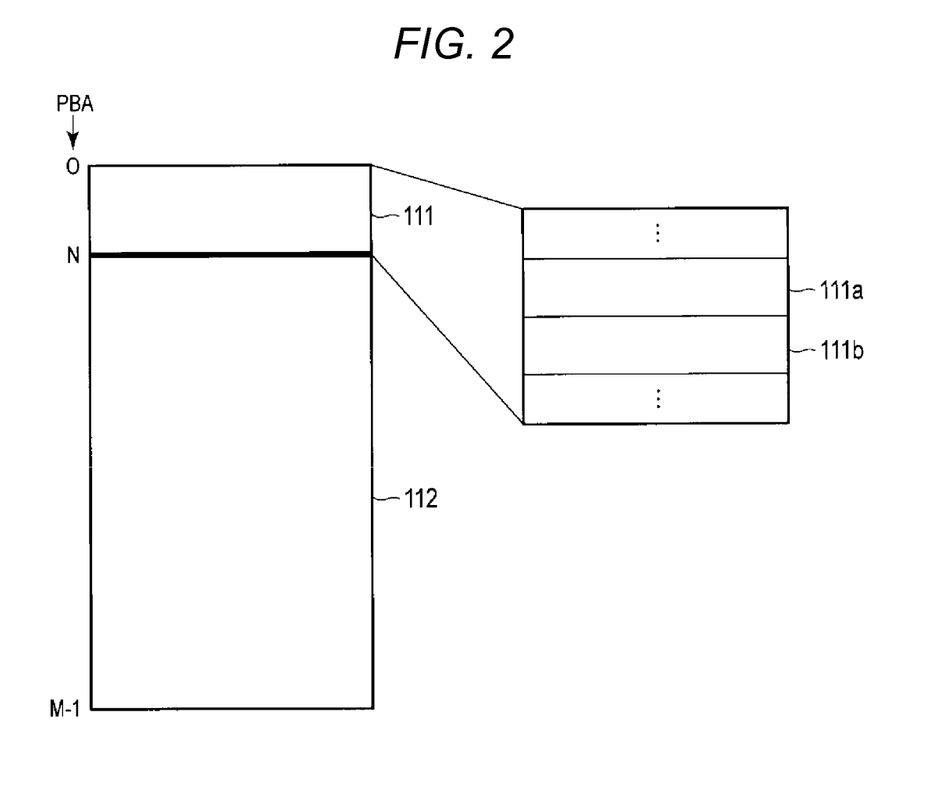
FIG. 2 illustrates a format of a storing area in an NAND memory in the hybrid drive in FIG. 1.
Figure 3:
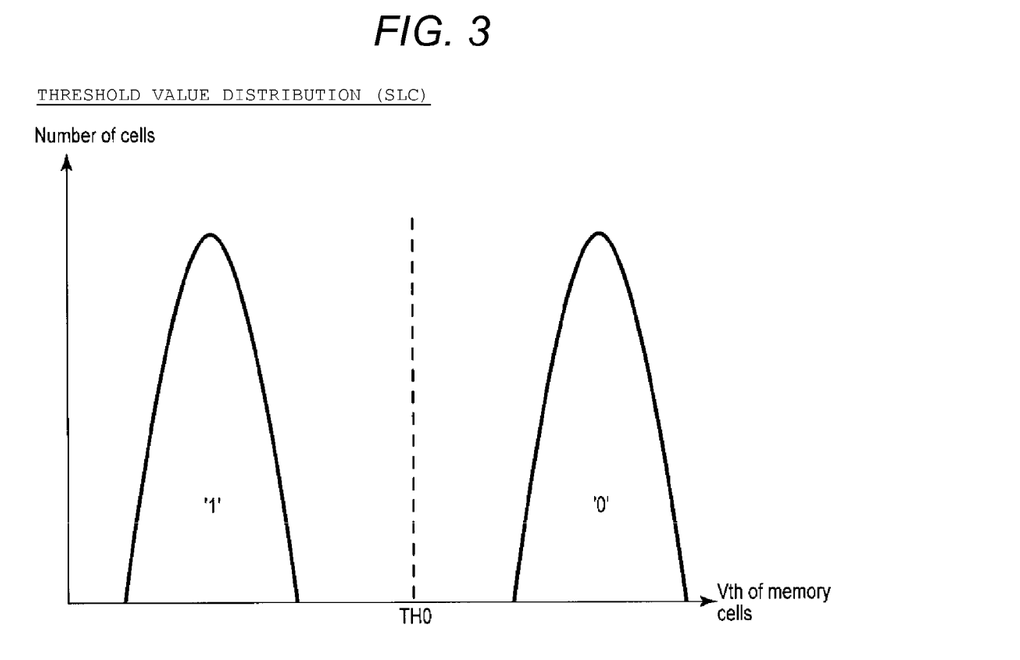
FIG. 3 illustrates a threshold value distribution of memory cells (2-valued memory cells) configuring a memory block in a Single Level Cell (SLC) area.

FIG. 2 illustrates an example of a format of the storing area in the NAND memory 11. As illustrated, the storing area of the NAND memory 11 includes M physical blocks. In the NAND memory 11, data items are erased all together in units of the block. That is, the block is a data erasing unit. The M blocks are formatted with respect to each of a system area 111 and a cache area 112.

The system area 111 includes N (N<M) physical blocks of which physical block addresses PBA are 0 to N−1, and stores management information necessary for managing a system (for example, the memory controller 12). In this embodiment, the system area 111 is a Single Level Cell (SLC) area. Here, the SLC area is a storing area including a plurality of memory cells, each of which is capable of storing one bit data. The system area 111 stores a cache management table 111a, a bad block list 111b, or the like.

The cache management table 111a is used for block management information which is used for managing each block in the cache area 112. The block management information is used as cache directory information related to an address (a stored position) of the data stored in each of the blocks (an area of a predetermined size) in the cache area 112. The cache directory information includes information for managing a correspondence between the physical block address PBA of the block in which the data is stored and a logic address of the data. The physical block address PBA indicates a position of the block in the NAND memory 11, in which the data is stored. The logic address indicates a position of the data in a logic address space.

The bad block list 111b is used for registering a bad block, which is an unusable block.

The cache area 112 includes M-N physical blocks of which physical block addresses PBA are N to M−1, and is used for storing data accessed by the host device. In the cache area 112, most recently accessed data and frequently accessed data are stored. Thus, it is possible to improve a performance by storing the frequently accessed data. In this embodiment, the cache area 112 is a Multi Level Cell (MLC) area. Here, the MLC area is a storing area including a plurality of memory cells, each of which is capable of storing multi-bit data. Furthermore, in general, M is sufficiently larger than N.

In addition, the storing area of the NAND memory 11 is not able to overwrite new update data in an area in which data is already stored. For this reason, a position of the cache management table 111a in the system area 111 is changed each time the table 111a is updated. The same also applies to a position of the bad block list 111b in the system area 111. Furthermore, the system area 111 and the cache area 112 may not be disposed as illustrated. For example, the system area 111 may be disposed below the cache area 112, and the system area 111 may be disposed between the cache areas 112.

(B) SLC Area

The SLC area 111 will be described with reference to FIG. 3. FIG. 3 illustrates a threshold voltage distribution (a threshold value distribution) of the memory cells (2-value memory cells) configuring the SLC area 111.

As illustrated, the threshold value distribution (a Vth distribution) of the memory cells configuring the SLC area 111 exhibits distribution of threshold voltages corresponding to "1" and "0" after data is recorded in the memory cells. Here, "1" is allocated for an ON state, and "0" is allocated for an OFF state.

At the time of reading the data, a read voltage TH0 is set in an intermediate position between the "0" distribution and the "1" distribution, and which data is retained by each of the memory cells is determined. In detail, at the time of applying the read voltage TH0 to a control gate of the memory cell, when the memory cell MC is in the ON state, it is determined to be "1", and when the memory cell is in the OFF state, it is determined to be "0."

Here, a recording capacity of the SLC area 111 is smaller than that of the MLC area 112, but a data retention ability of the SLC area 111 is higher than that of the MLC area 112. For this reason, in the SLC area 111, the number of rewritable times (hereinafter, "writing limit) is large, and a life time of the memory cell is long. Therefore, according to the hybrid drive 1 of this embodiment, data that requires reliability is stored in the SLC area 111, which is a system area.

(C) MLC Area

Next, the MLC area 112 will be described with reference to FIG. 4. FIG. 4 illustrates a threshold voltage distribution (a threshold value distribution) of the memory cells (multi-value memory cells) configuring the MLC area 112.

As illustrated, in the multi-value memory cells configuring the MLC area 112, four threshold value distribution appears when 2-bit data is stored in one memory cell by more finely controlling an injection amount of electrons with respect to a floating gate of the memory cell in the write state. For this reason, the multi-value memory cell according to this embodiment is a 4-value memory cell. Furthermore, the multi-value memory cell is not limited to the 4-value memory cell. For example, eight threshold value distribution appears when 3 bits are retained in one memory cell.

Figure 4:
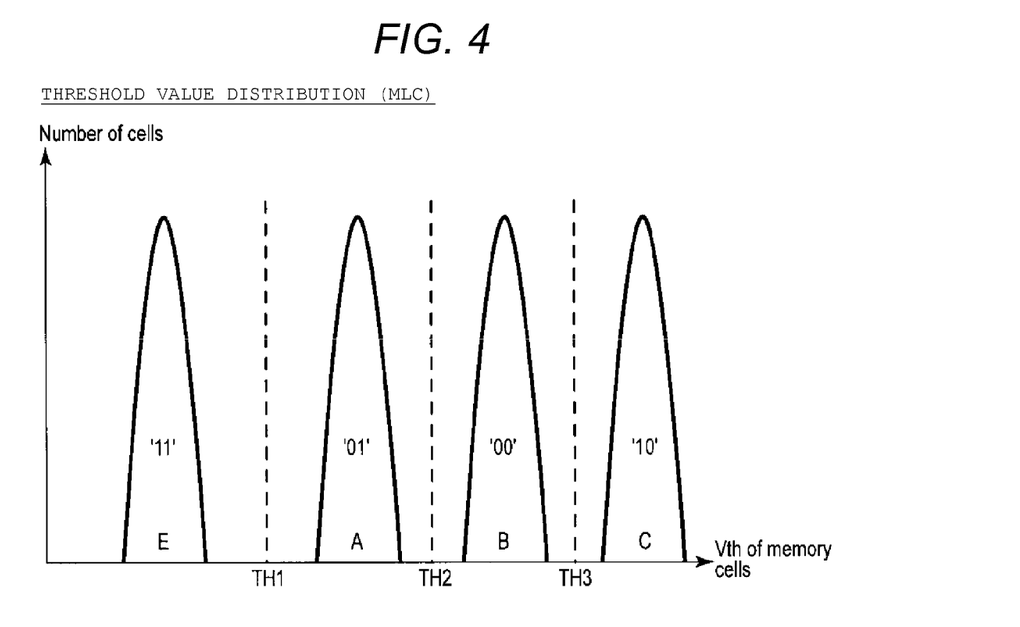
FIG. 4 illustrates a threshold value distribution of memory cells (4-valued memory cells) configuring a memory block in a Multi Level Cell (MLC) area.

In the four threshold value distributions (a Vth distribution) of the 4-value memory cells illustrated in FIG. 4, "11", "01", "00", and "10" are allocated in order of increase of the threshold voltage. Furthermore, the four threshold value distributions may be referred to as an "E" level, an "A" level, a "B" level, and a "C" level in order of the increase of the threshold voltage.

At the time of reading the data, read voltages TH1, TH2, and TH3 are set in each intermediate position between the distributions, and which of "11", "01", "00", and "10" is retained by each of the memory cells is determined.

The recording capacity of the MLC area 112 is larger (in this embodiment, doubled) than that of the SLC area 111, but the data retention ability of the MLC area 112 is lower than that of the SLC area 111. For this reason, in the MLC area 112, the number of rewritable times is smaller, and the life time of the memory cell is shorter. Therefore, in the hybrid drive 1 according to this embodiment, data as a read cache for which reliability is less important is stored in the MLC area 112, which is a cache area.

1-3. Tables T1 and T2

Next, the tables T1 and T2 will be described with reference to FIG. 5 and FIG. 6.

Figure 5:
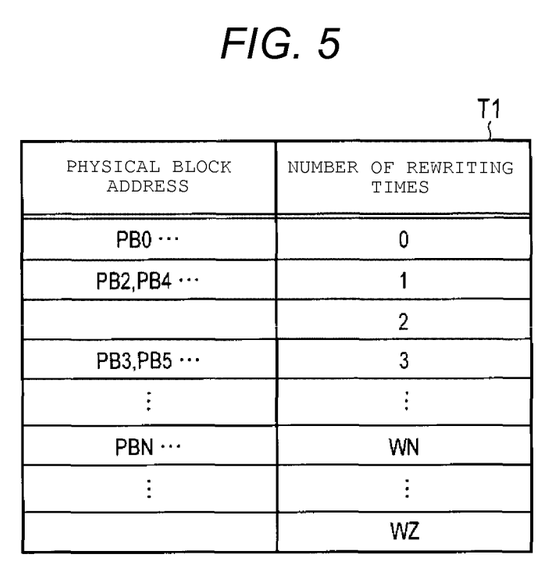
FIG. 5 illustrates a table T1 stored in the NAND memory.

FIG. 5 illustrates the table T1 stored in the ROM 124 in FIG. 1. As illustrated, in the table T1, the number of rewriting times (0, 1, 2, 3, . . . , and WZ) including the writing limit WN of the MLC area 112 is shown in association with the physical block addresses (PB0, PB1, PB2, . . . ). Here, in this embodiment, the writing limit WN is, for example, approximately 60% to 80% of the maximum number of rewritable times WZ. Furthermore, it is preferable that the writing limit WN be evaluated and set for each NAND memory 11 being used. In addition, the writing limit WN is set with a predetermined margin with respect to the maximum number of rewritable times WZ.

Figure 6:
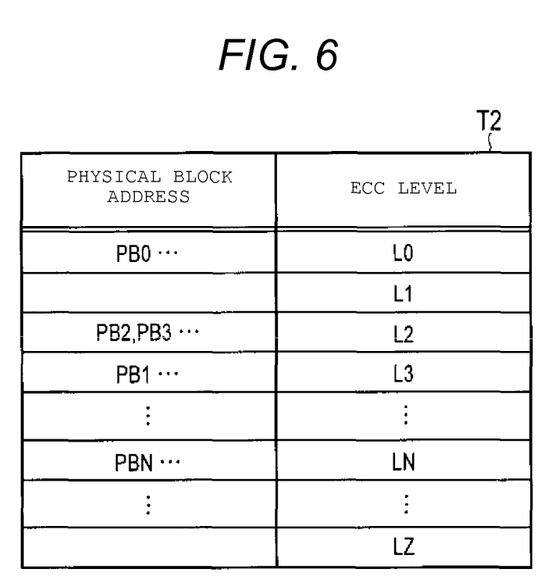
FIG. 6 illustrates a table T2 stored in the NAND memory.

FIG. 6 illustrates the table T2 stored in the ROM 124 in FIG. 1. As illustrated, in the table T2, an Error Correcting Code (ECC) level (L0, L1, L2, L3, . . . , and LZ) including a limit level LN of the MLC area 112 is shown in association with the physical block addresses (PB0, PB1, PB2, . . . ). Here, in this embodiment, for example, when a maximum correction bit length is approximately 80 bits, it is preferable that the limit level LN be approximately 60 bits. This is because the limit level LN is set with a predetermined margin with respect to the maximum ECC level LZ, similar to the above description.

Furthermore, in the tables T1 and T2 according to this embodiment, although the number of rewriting times or the like and the physical block addresses are associated with each other, it is not limited thereto. For example, in a predetermined table, the number of rewriting times or the like and page addresses may be associated with each other. Further, it is not limited to a table format, and a predetermined function or the like may be also stored in the FROM 124.

2-1. Data Write Operation

Figure 7:
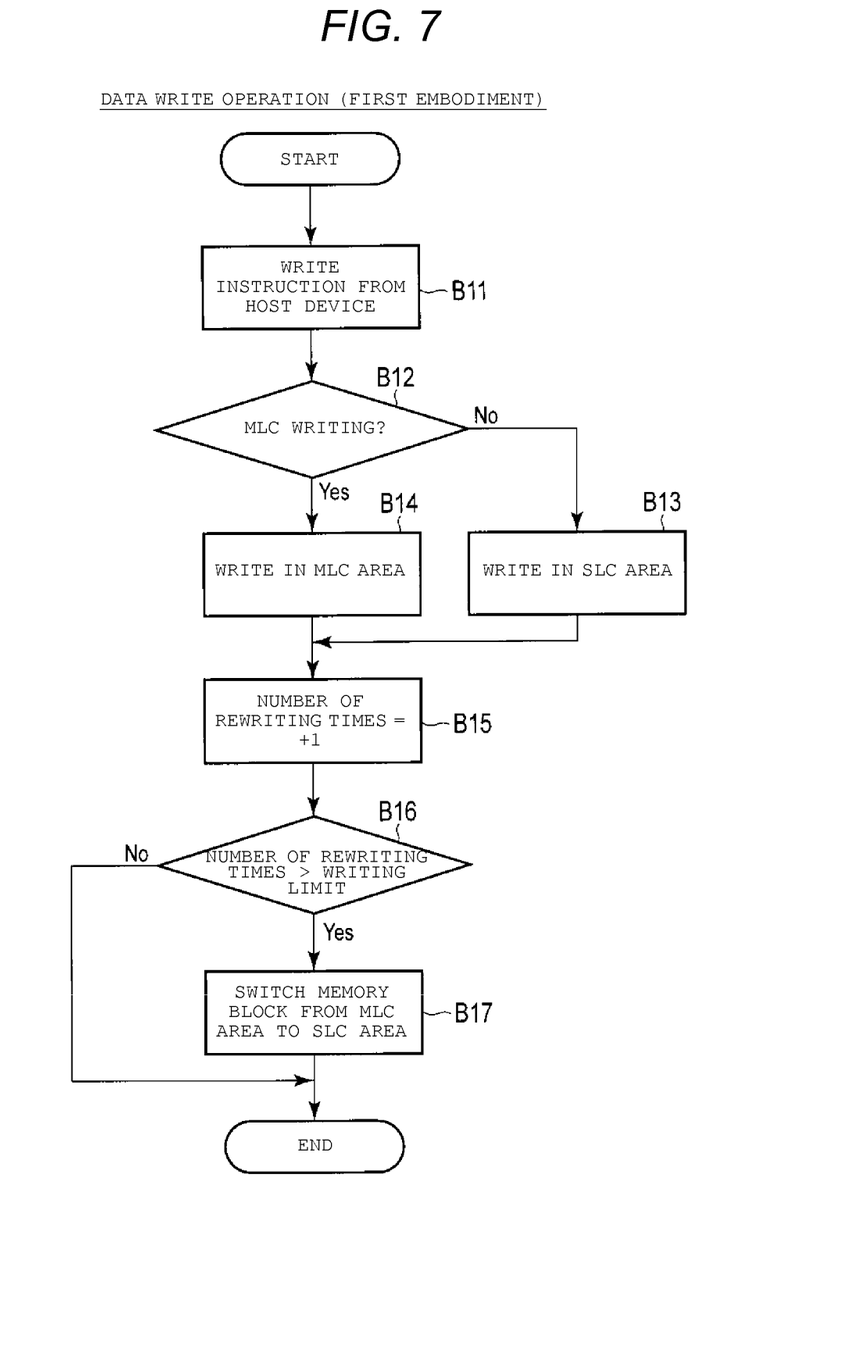
FIG. 7 is a flow of a data write operation into the NAND memory according to the first embodiment.

In the configuration described above, a data write operation with respect to the NAND memory 11 according to the first embodiment will be described with reference to FIG. 7. FIG. 7 is a flow illustrating the data write operation with respect to the NAND memory 11 according to the first embodiment.

As illustrated in FIG. 7, first, in Block B11, the memory controller 12 receives a data write instruction (the write request) from the host device. In detail, the memory controller 12 receives the write command, the write data, and the address from the host device as the data write instruction.

In Block B12, the memory controller 12 determines whether or not the received data write instruction is MLC writing.

In Block B13, when it is determined that the received data write instruction is not the MLC writing in Block B12 (No), the memory controller 12 writes the received write data in the SLC area 111.

In Block B14, when it is determined that the received data write instruction is the MLC writing in Block B12 (Yes), the memory controller 12 writes the received write data in the memory blocks in the MLC area 112.

In Block B15, the memory controller 12 increases the number of writing times (the number of rewriting times) with respect to the memory blocks in the MLC area 112 by one (+1).

In Block B16, the memory controller 12 determines whether or not the number of rewriting times with respect to the memory blocks exceeds the writing limit WN with reference to the table T1.

By performing a process of Block B16, it is possible to determine a usage state of the MLC area 112 of the NAND memory 11. In other words, whether or not the MLC area 112 can be used is determined according to an exhaustion degree of memory blocks in the MLC area 112 of the NAND memory 11. That is, in Block B16, when it is determined that the number of rewriting times does not exceed the writing limit WN (No), it is determined that the exhaustion degree of the MLC area 112 is still low and the MLC area 112 can be used, and then the operation ends.

On the other hand, in Block B17, when it is determined that the number of rewriting times exceeds the writing limit WN in Block B16 (Yes), the memory controller 12 switches the memory block from the MLC area 112 to the SLC area 111A. In detail, when the number of rewriting times exceeds the writing limited WN, and it is determined that the exhaustion degree of the MLC area 112 of the physical block address PBN is high, the memory controller 12 does not perform a bad block registration with respect to the memory block into the bad block list 111b that is stored in the block of the MLC area 112. Then, with respect to the block of the physical block address PBN of the MLC area 112, it is determined that the data retention ability of the memory cell is insufficient, and the memory block is used for the SLC area 111A instead of the MLC area 112 to be continuously used. The control is performed by, for example, firmware (FW) of the memory controller 12.

According to the embodiment, even though the memory block is determined to be unusable as the MLC area 112, the category of the memory block is switched from the MLC area 112 to the SLC area 111A to be continuously used, and thus it is possible to reduce the data capacity of the NAND memory 11 that would be lost by the bad block registration. For this reason, it is possible to reliably use the NAND memory 11 for a longer period, and thus it is possible to prevent the performance of the hybrid drive 1 from being lowered.

2-2. Data Read Operation

Figure 8:
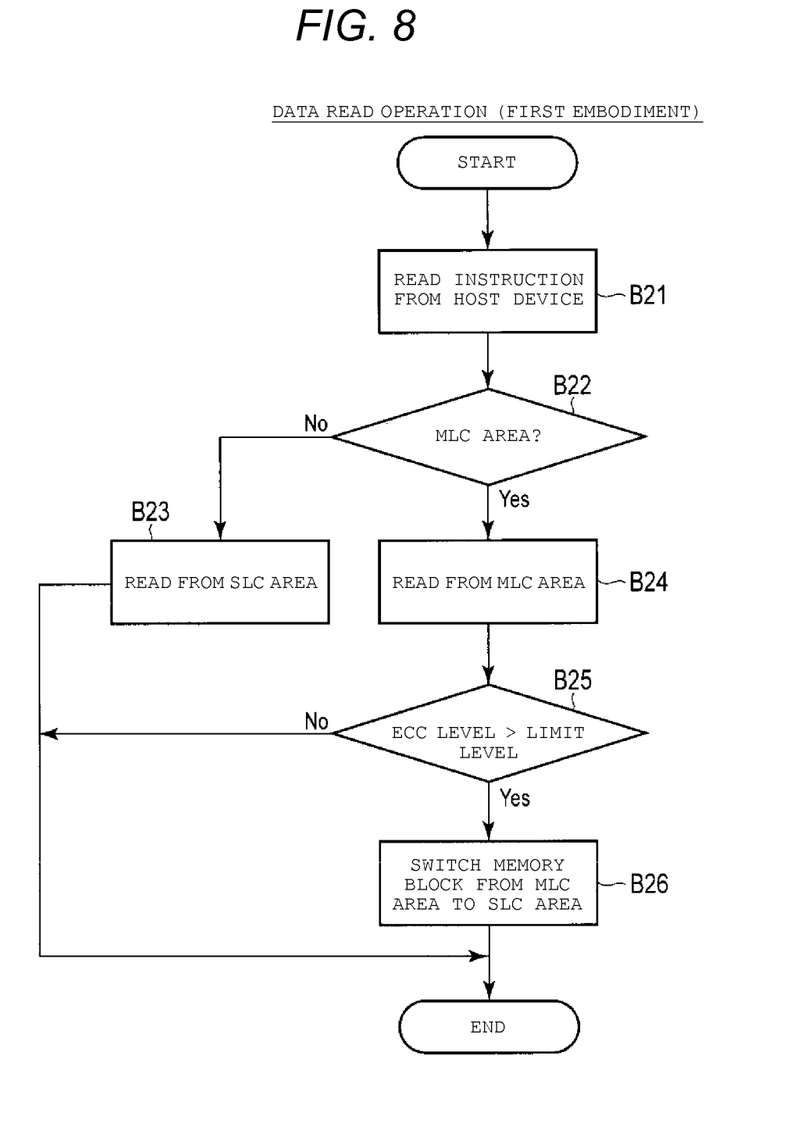
FIG. 8 is a flow of a data read operation from the NAND memory according to the first embodiment.

Next, a data read operation from the NAND memory 11 according to the first embodiment will be described with reference to FIG. 8. FIG. 8 is a flow of the data read operation from the NAND memory 11 according to the first embodiment.

As illustrated in FIG. 8, first, in Block B21, the memory controller 12 receives a data read instruction (the read request) from the host device. In more detail, the memory controller 12 receives the read command and the address from the host device as the data read instruction.

In Block B22, the memory controller 12 determines whether or not the received data read instruction is read from the MLC area 112.

In Block B23, when it is determined that the received data read instruction is not read from the MLC area 112 in Block B22 (No), the memory controller 12 reads the data related to the instruction from the SLC area 111, and thus the operation ends.

In Block B24, when it is determined that the received data read instruction is read from the MLC area 112 in Block B22 (Yes), the memory controller 12 reads the data related to the instruction from the MLC area 112.

In Block B25, the memory controller 12 determines whether or not the ECC level of the data (page data) read from the MLC area 112 exceeds the limit level LN with reference to the table T2. In detail, the memory controller 12 determines whether or not the ECC level (an error bit length) applied in each sector unit of the page data read from the MLC area 112 exceeds the limit level LN. For example, when the limit level LN is 60 bits, the memory controller 12 determines whether or not the error bit length of the ECC level used at the time of reading the data exceeds 60 bits.

By performing a process of Block B25, similar to B16, it is possible to determine the usage state of the MLC area 112 of the NAND memory 11. That is, when it is determined that the ECC level does not exceed the limit level LN in Block B25 (No), it is determined that the exhaustion degree of the MLC area 112 is still low and the MLC area 112 is able to be used, and thus the operation ends.

On the other hand, in Block B26, when it is determined that the ECC level exceeds the limit level LN in Block B25 (Yes), the memory controller 12 switches the category of the memory block from the MLC area 112 to the SLC area 111A. In detail, when the ECC level exceeds the limit level LN, and it is determined that the exhaustion degree of the MLC area 112 is high, the memory controller 12 does not perform the bad block registration with respect to the memory block into the bad block list 111b that is stored in the block of the MLC area 112. Then, in the block of the MLC area 112, it is determined that the data retention capability of the memory cell in the memory block is insufficient to use as the MLC area 112, and the memory block is used as the SLC area 111A instead of the MLC area 112 to be continuously used. The control is performed by, for example, firmware (FW) of the memory controller 12.

As set forth above, also in the data read operation, a usage state of the MLC area 112 is determined, and the category of the memory block is switched from the MLC area 112 into the SLC area 111A to be continuously used, and thus it is possible to reduce the data capacity that would be lost by the bad block registration. For this reason, it is possible to reliably use the NAND memory 11 for a longer period, and thus it is possible to prevent the performance of the hybrid drive 1 from being lowered.

3. Effects

As described above, at least the following effect (1) is able to be obtained according to the first embodiment.

(1) It is possible to reliably use the NAND memory 11 for a longer period, and thus it is possible to prevent the performance of the hybrid drive 1 from being lowered.

Here, the effects of the first embodiment will be described in comparison to a comparative example, with reference to FIG. 9.

A storing area of an NAND memory according to the comparative example is physically categorized into an SLC area as a system area and an MLC area as a cache area. For this reason, after a predetermined time period elapses for use, when it is determined that a memory block of the MLC area of a certain physical block address is insufficient to be used as the MLC area, a bad block registration is performed with respect to the memory block. As a result, a bad block area, which is unusable, increases over time according to the use of the memory cell. As it is not possible to reliably use the NAND memory, a performance of hybrid drive is lowered.

In addition, the low performance becomes more remarkable according to an advance of a generation of the NAND memory. That is, when the generation of the NAND memory advances, as the size of the memory cell becomes smaller, the NAND memory is rapidly degraded even when data write or data read is performed the same number of times as the former generation. For this reason, the number of writing times rapidly reaches the writing limit of the NAND memory or a limit level of an ECC level. As a result, the bad block area, which is a unusable area, increases rapidly, and thus the performance of the hybrid drive is lowered more rapidly according to decrease in the data capacity of the storing area.

On the other hand, according to the first embodiment, when it is determined that the number of rewriting times exceeds the writing limit WN in the data write operation, the memory controller 12 does not perform the bad block registration with respect to the memory block of the MLC area 112, and the category of the memory block is switched into the SLC area 111A (B17 in FIG. 7). In other words, the memory controller 12 controls the NAND memory 11 such that the number of bits stored in the memory cells of the memory blocks is reduced based on the usage state of the storing area.

Further, when it is determined that the ECC level exceeds the limit level LN in the data read operation, the memory controller 12 does not perform the bad block registration with respect to the MLC area 112, and the category of the memory block is switched from the MLC area 112 into the SLC area 111A (B26 in FIG. 8).

Figure 9:
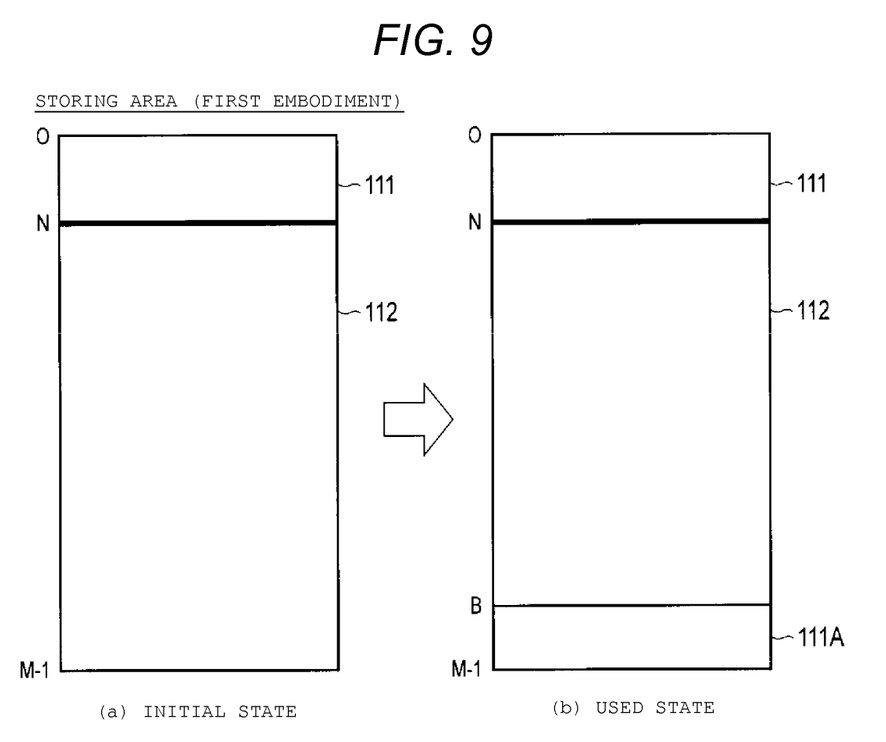
FIG. 9 illustrates a storing area of the NAND memory, in which (a) is an initial state, and (b) is a used state.

For this reason, the storing area of the NAND memory 11 according to the first embodiment is, for example, illustrated in FIG. 9. As illustrated in FIG. 9, in the first embodiment, the bad block registration is not performed with respect to a memory block of the MLC area 112 of the physical block addresses B to M−1 in (b) a predetermined state after being used. Further, the category of the memory block is switched from the MLC area 112 into the SLC area 111A. As a result, the life time of the memory cell is substantially extended, and thus the NAND memory 11 is able to be effectively used for a long period, and the performance of the hybrid drive 1 is able to be prevented from being lowered.

In other words, the SLC area 111 and the MLC area 112 are used by being switched adaptively according to the usage state of the NAND memory 11, and thus it is possible to suppress a decrease in the data capacity of the NAND memory 11 due to early exhaustion in accordance with a structure of the NAND memory 11. For this reason, it is possible to maximize a usable period of the NAND memory 11, and thus it is possible to maximize a performance sustainable period of the hybrid drive 1.

Furthermore, as in the hybrid drive 1 according to the first embodiment, when the NAND memory 11 is used as the cache memory, in general, the entire data is recorded in the magnetic disk 21. For this reason, reliability required for the memory block of the MLC area 112 which is determined as being exhausted is not high compared to the memory block of the SLC area 111. In addition, by switching the category of the memory block from the MLC area 112 into the SLC area 111A, a storage capacity of a recording device as a whole is not affected even when the data capacity of the NAND memory 11 decreases, and thus it is not a problem. Thus, the first embodiment is more effective by being implemented in the hybrid drive 1.

Second Embodiment

Next, hybrid drive according to a second embodiment will be described. In this description, the specific description of the same parts as the first embodiment will be omitted.

Storing Area of NAND Memory

The second embodiment is different from the first embodiment in that the cache area of the storing area of the NAND memory 11 is formatted as an MLC area (8-valued) 112A in an initial state.

Data Write Operation

Figure 10:
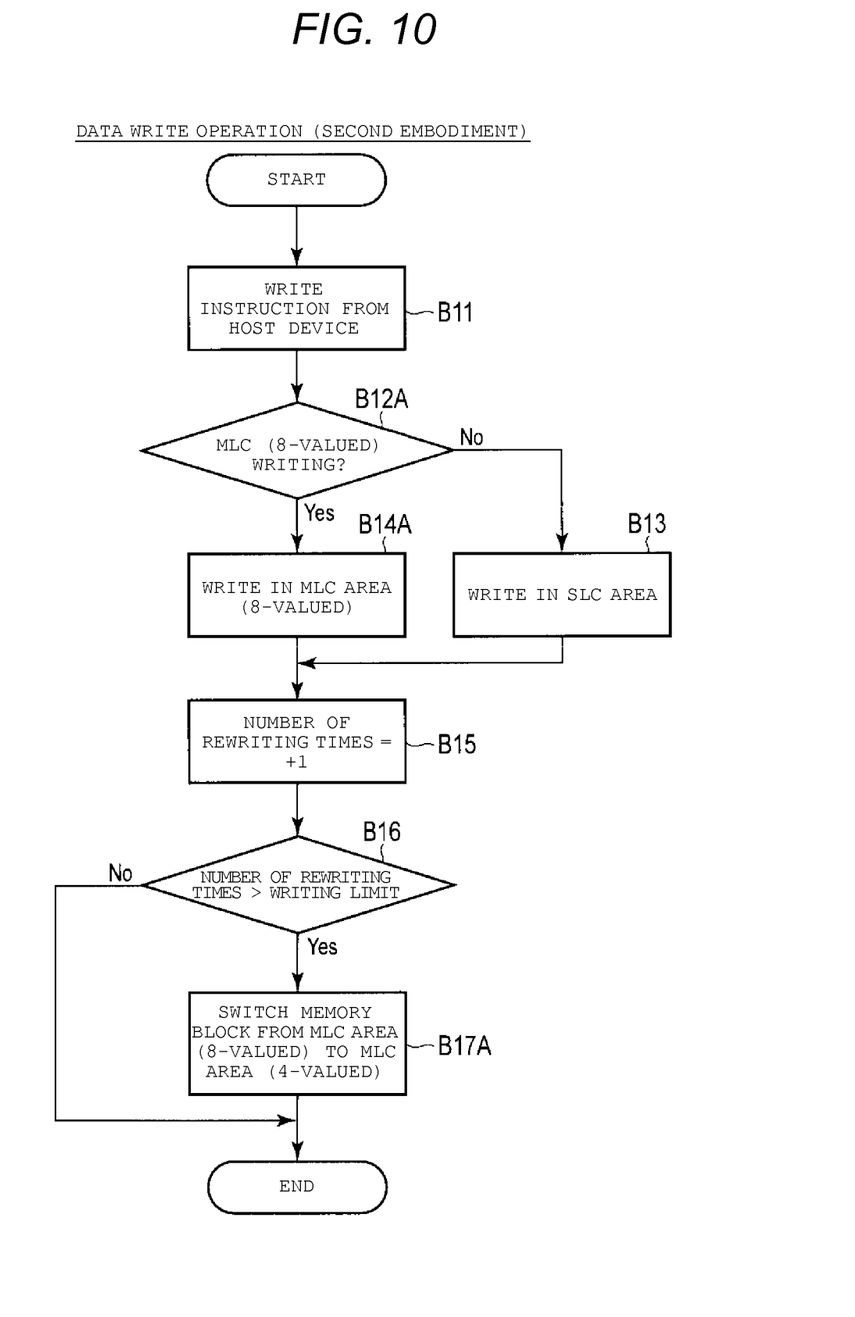
FIG. 10 is a flow of a data write operation into an NAND memory according to a second embodiment.

Next, a data write operation of the NAND memory 11 according to the second embodiment will be described with reference to FIG. 10. As illustrated in FIG. 10, the data write operation according to the second embodiment is different from the first embodiment in the following points.

First, in Block B12A, the memory controller 12 determines whether or not the received data write instruction is MLC (8-valued) writing.

In Block B14A, when it is determined that the received data write instruction is the MLC (8-valued) writing in Block B12A (Yes), the memory controller 12 writes the received write data in the MLC area (8-valued) 112A.

In Block B17A, when it is determined that the number of rewriting times exceeds the writing limit WN in Block B16 (Yes), the memory controller 12 switches the MLC area (8-valued) 112A into an MLC area (4-valued) 112. In detail, when it is determined that the number of rewriting times exceeds the writing limit WN, and a exhaustion degree of the MLC area (8-valued) 112A is high, the memory controller 12 does not perform the bad block registration with respect to the memory block into the bad block list 111b that is stored in a block of the MLC area (8-valued) 112A. Then, in the block of the MLC area (8-valued) 112A, it is determined that the data retention capability of the memory cell is insufficient as the MLC area (8-valued) 112A, and the block is switched into the MLC area (4-valued) 112 to be continuously used.

Data Read Operation

Figure 11:
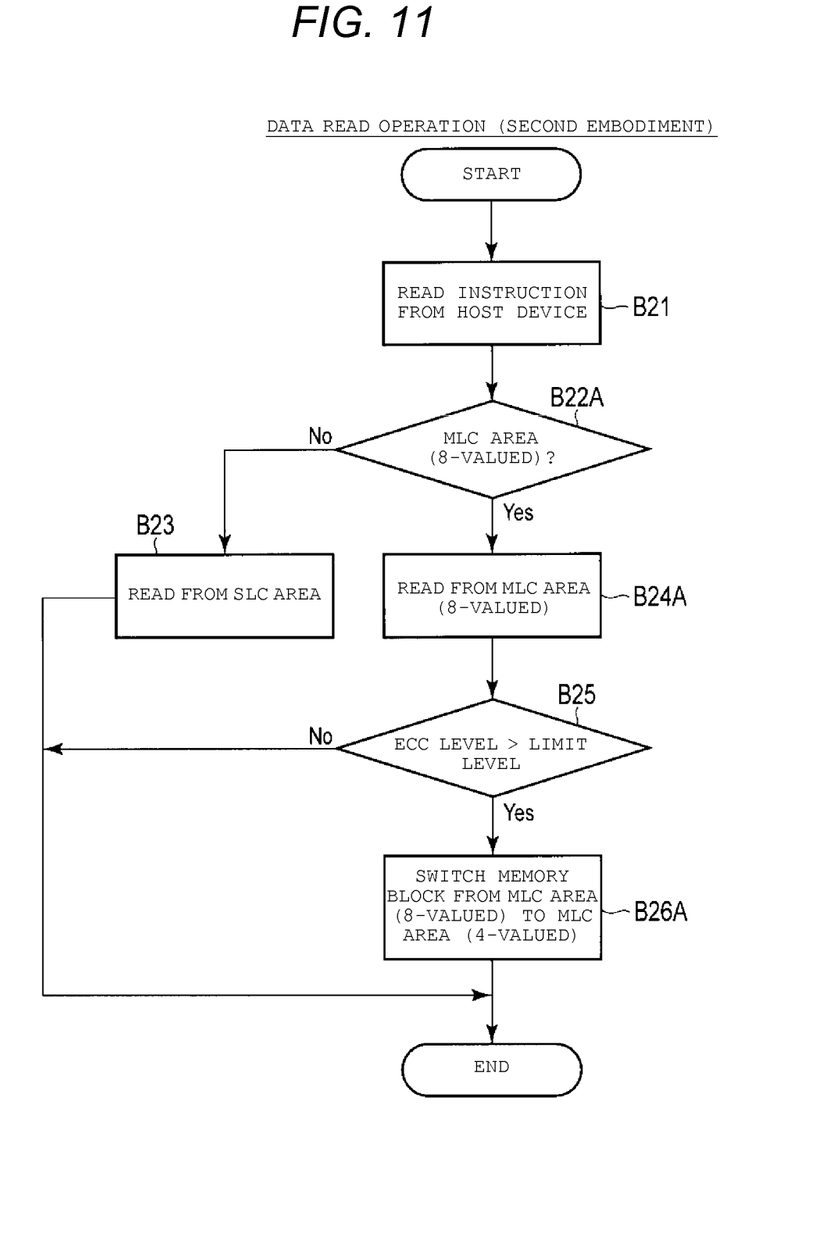
FIG. 11 is a flow of a data read operation from the NAND memory according to the second embodiment.

Next, a data read operation of the NAND memory 11 according to the second embodiment will be described with reference to FIG. 11. As illustrated in FIG. 11, the data read operation according to the second embodiment is different from the first embodiment in the following points.

In Block B22A, the memory controller 12 determines whether or not the received data read instruction is read from the MLC area (8-valued) 112A.

In Block B24A, when it is determined that the received data read instruction is read from the MLC area (8-valued) 112A in Block B22A (Yes), the memory controller 12 reads the data related to the instruction from the MLC area (8-valued) 112A.

In Block B26A, when it is determined that the ECC level exceeds the limit level LN in Block B25 (Yes), the memory controller 12 switches the MLC area (8-valued) 112A into the MLC area (4-valued) 112.

Effects

As described above, at least the same effects as above (1) are able to be obtained by the hybrid drive 1 according to the second embodiment.

Further, according to the second embodiment, the memory controller 12 switches the MLC area (8-valued) 112A into the MLC area (4-valued) 112 in the data write operation and the data read operation (B17A in FIG. 10 and B26A in FIG. 11).

Figure 12:
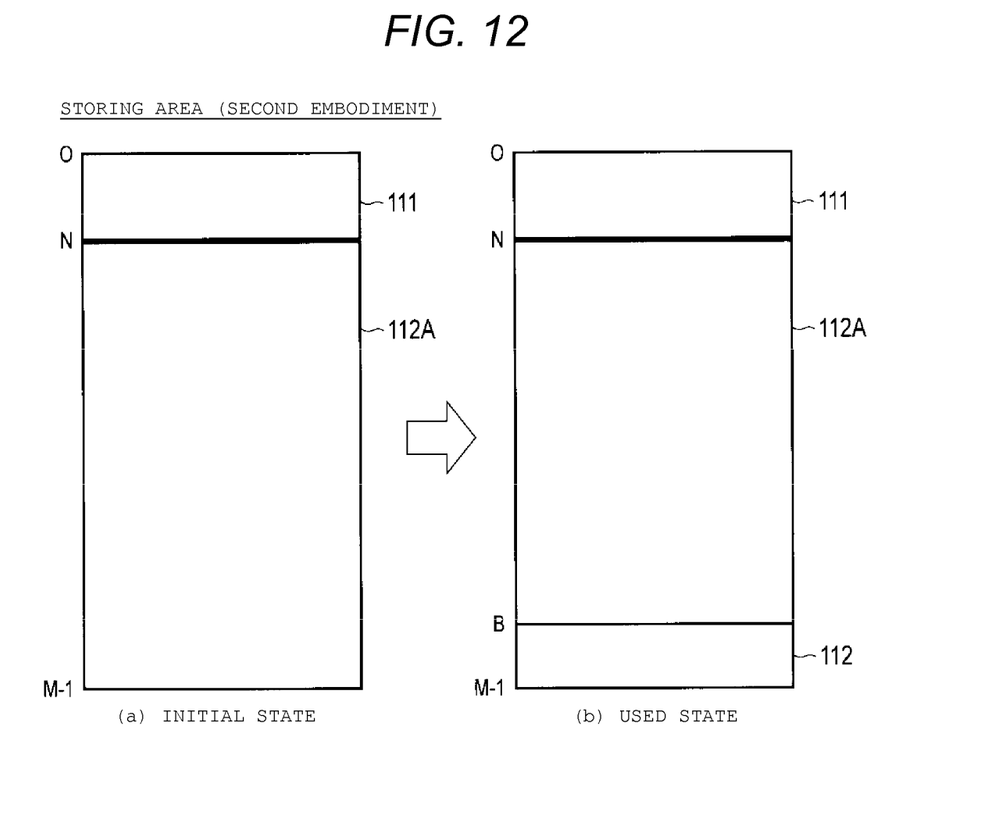
FIG. 12 illustrates a storing area of the NAND memory according to the second embodiment, in which (a) is an initial state, and (b) is a used state.

For this reason, for example, as illustrated by the storing area in FIG. 12(b), the bad block registration is not performed with respect to a memory block of the MLC area (8-valued) 112A of the physical block addresses B to M−1. Then, the category of the memory block is switched from the MLC area (8-valued) 112A to the MLC area (4-valued) 112. As a result, the life time of the memory cell is substantially extended, and the NAND memory 11 is able to be reliably used for a longer period, and the performance of the hybrid drive 1 is able to be further prevented from being lowered.

Modification Example

In the second embodiment described above, although the category of the memory block is switched from the MLC area (8-valued) 112A in the MLC area (4-valued) 112, it is not limited thereto. For example, if necessary, the category of the memory block is also able to be switched from the MLC area (8-valued) 112A to an SLC area (2-valued) 111A.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device, comprising:
a first nonvolatile memory that includes a plurality of memory cells;
a second nonvolatile memory of which memory capacity is larger than a memory capacity of the first nonvolatile memory; and
a memory controller configured to control data writing with respect to the first nonvolatile memory, and switch a data writing manner for a part of the memory cells from a first data writing manner according to which data of a first number of bits are written in each memory cell of the part, to a second data writing manner according to which data of a second number of bits that is smaller than the first number are written in each memory cell of the part, according to a usage amount of the part of the memory cells.

2. The storage device according to claim 1, wherein the usage amount is indicated by a number of times data have been written in the part of the memory cells.

3. The storage device according to claim 1, wherein the memory controller is further configured to cause data stored in the part of the memory cells to be read out, and
the usage amount is indicated by a bit length of error correction data corresponding to data read out from the part of the memory cells.

4. The storage device according to claim 1, wherein the memory controller is configured to cause system data to be written in the first nonvolatile memory according to the first writing manner, and cache data to be written in the first nonvolatile memory according to the second writing manner.

5. The storage device according to claim 1, wherein the first nonvolatile memory is a NAND-type semiconductor memory.

6. The storage device according to claim 5, wherein the second nonvolatile memory is a magnetic memory.

7. The storage device according to claim 1, wherein the first number is equal to or greater than two, and the second number is one.

8. A memory controller of a nonvolatile memory that includes a plurality of memory cells, the memory controller comprising:
a memory interface configured to transmit data to the nonvolatile memory and receive data from the nonvolatile memory; and
a control circuit configured to control data writing with respect to the first nonvolatile memory, and switch a data writing manner for a part of the memory cells from a first data writing manner according to which data of a first number of bits are written in each memory cell of the part, to a second data writing manner according to which data of a second number of bits that is smaller than the first number are written in each memory cell of the part, according to a usage amount of the part of the memory cells.

9. The memory controller according to claim 8, wherein the usage amount is indicated by a number of times data have been written in the part of the memory cells.

10. The memory controller according to claim 8, wherein the usage amount is indicated by a bit length of error correction data corresponding to data read from the part of the memory cells.

11. The memory controller according to claim 8, wherein the control circuit is configured to cause system data to be written in the nonvolatile memory according to the first writing manner, and cache data to be written in the nonvolatile memory according to the second writing manner.

12. The memory controller according to claim 8, wherein the nonvolatile memory is a NAND-type semiconductor memory.

13. The memory controller according to claim 8, wherein the first number is equal to or greater than two, and the second number is one.

14. A method for controlling a storage device having a first nonvolatile memory that includes a plurality of memory cells, and a second nonvolatile memory of which memory capacity is larger than a memory capacity of the first nonvolatile memory, the method comprising:
controlling data writing with respect to the first nonvolatile memory; and
switching a data writing manner for a part of the memory cells from a first data writing manner according to which data of a first number of bits are written in each memory cell of the part, to a second data writing manner according to which data of a second number of bits that is smaller than the first number are written in each memory cell of the part, according to a usage amount of the part of the memory cells.

15. The method according to claim 14, further comprising:
reading out data stored in the part of the memory cells; and
determining a bit length of error correction data corresponding to read data, wherein
the usage amount is indicated by the bit length.

16. The method according to claim 14, further comprising:
determining a number of times data have been written in the part of the memory cells, wherein
the usage amount is indicated by the number of times.

17. The method according to claim 14, wherein
system data are written in the first nonvolatile memory according to the first writing manner, and cache data are written in the first nonvolatile memory according to the second writing manner.

18. The method according to claim 14, wherein
the first nonvolatile memory is a NAND-type semiconductor memory.

19. The method according to claim 18, wherein
the second nonvolatile memory is a magnetic memory.

20. The method according to claim 14, wherein
the first number is equal to or greater than two, and the second number is one.

* * * * *